United States Patent
Pai et al.

(10) Patent No.: US 6,541,871 B2
(45) Date of Patent: Apr. 1, 2003

(54) METHOD FOR FABRICATING A STACKED CHIP PACKAGE

(75) Inventors: Tsung-Ming Pai, Tainan Hsien (TW); Chung-Hao Lee, Chia-Yi Hsien (TW); Pao-Hei Chang Chin, Kaohsiung Hsien (TW); Meng-Hui Lin, Kaohsiung (TW); Song-Fei Wang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/098,516

(22) Filed: Mar. 18, 2002

(65) Prior Publication Data

US 2002/0094605 A1 Jul. 18, 2002

Related U.S. Application Data

(62) Division of application No. 09/562,910, filed on May 2, 2000, now Pat. No. 6,387,728.

(51) Int. Cl.[7] .......................... H01L 23/48; H01L 23/52; H01L 29/40
(52) U.S. Cl. .................. 257/777; 257/687; 257/701; 257/702; 257/783
(58) Field of Search ................................. 257/687, 701, 257/702, 777, 783

(56) References Cited

U.S. PATENT DOCUMENTS

| | | |
|---|---|---|
| 4,388,128 A | 6/1983 | Ogawa et al. |
| 5,208,188 A | 5/1993 | Newman |
| 5,323,060 A | 6/1994 | Fogal et al. |
| 5,422,435 A | 6/1995 | Takiar et al. |
| 5,478,781 A | 12/1995 | Bertin et al. |
| 5,691,567 A | 11/1997 | Lo et al. |
| 5,745,985 A | 5/1998 | Ghosh et al. |
| 5,811,317 A | 9/1998 | Maheshwari et al. |
| 5,923,090 A * | 7/1999 | Fallon et al. ................ 257/777 |
| 5,973,403 A * | 10/1999 | Wark .......................... 257/777 |
| 6,084,308 A | 7/2000 | Kelkar et al. |
| 6,098,278 A * | 8/2000 | Vindasius et al. ............ 29/830 |
| 6,099,959 A | 8/2000 | Konrad et al. |
| 6,150,724 A | 11/2000 | Wenzel et al. |
| 6,191,483 B1 * | 2/2001 | Loo ............................ 257/737 |
| 6,252,305 B1 | 6/2001 | Lin et al. |
| 6,258,626 B1 * | 7/2001 | Wang et al. ................. 438/107 |

* cited by examiner

Primary Examiner—Albert W. Paladini
Assistant Examiner—David A. Zarneke

(57) ABSTRACT

A method for fabricating a stacked chip package comprises the steps of: (a) attaching a first semiconductor chip to an upper surface of a substrate through a first adhesive layer; (b) partially curing the first adhesive layer such that it gels but does not harden; (c) attaching a second semiconductor chip to the first semiconductor chip through a second adhesive layer; (d) curing the first and second adhesive layer; (e) electrically coupling the first and second semiconductor chips to a structure for making external electrical connection provided on the substrate; and (f) forming a package body over the first semiconductor chip, the second semiconductor chip, and a portion of the upper surface of the substrate. Since the first and second adhesive layers may be cured in one single step, the cycle time may be reduced thereby cutting down the production cost.

6 Claims, 3 Drawing Sheets

METHOD FOR FABRICATING A STACKED CHIP PACKAGE

This application is a Divisional of application Ser. No. 09/562,910 filed May 2, 2000, now U.S. Pat. No. 6,387,728.

BACKGROUND OF THE INVENTION

1. Field of the Invention

This invention relates to a method for fabricating a stacked chip package, and more specifically to packaging semiconductor chips on a substrate in a stacking arrangement.

2. Description of the Related Art

FIG. 1 depicts a conventional stacked chip package 100 comprising two chips 110, 130 stacked each other. The chip 110 is attached onto the upper surface of a substrate 150 through an adhesive layer 112. An adhesive layer 132 is interposed between the chips 110, 130. The chips 110, 130 are respectively connected to chip connection pads 152 on the upper surface of the substrate 150 through bonding wires 114, 134. The lower surface of the substrate 150 is provided with a plurality of solder pads electrically connected to the chip connection pads 152 on the upper surface of the substrate 150. Each solder pad 154 is provided with a solder ball 156 for making external electrical connection. A package body 160 encapsulates the chips 110, 130, the bonding wires 114, 134 and a portion of the upper of the substrate 150. Typically, the adhesive layers 112, 132 are made of thermosetting epoxy material.

Referring to FIG. 2, in mass production of the stacked chip package 100, it is desirable to integrally form a plurality of substrates in a strip 170 having alignment holes (not shown) so as to facilitate the automation packaging process (including encapsulation). Normally, the semiconductor chip is formed of microcrystalline silicon with a coefficient of thermal expansion (CTE) of 3–5 ppm° $C.^{-1}$. The strip 170 is usually formed of polymer impregnated fiberglass having a coefficient of thermal expansion of 25–40 ppm° $C.^{-1}$ and the thickness of the strip is less than 0.36 mm. Since there is a significant difference between the semiconductor chip 110 and the strip 170 in CTE and the strip 170 is rather thin, the semiconductor chip 110 and the strip 170 expand and contract in different amounts along with temperature fluctuations during the curing process of the adhesive layer 112 thereby causing the semiconductor chip 110 and the substrate 150 to warp. The curing process of the adhesive layer (such as 8355F epoxy adhesive available from ABLESTICK LABORATORY) typically requires one hour of precure at 110° C. and two hours of postcure at 175° C. The higher curing temperature and longer curing time are employed, the greater warpage the semiconductor chip 110 and the substrate 150 will produce.

Referring to FIG. 2, the warped substrate 150 and semiconductor chip 110 will result in adverse influences on the chip 100 itself and the subsequent manufacturing process. For example, the warped substrate 150 and semiconductor chip 110 may bring about positioning errors during dispensing the adhesive layer 132, such that the epoxy adhesive can not be dispensed in precise amounts and to correct positions on the chip 110. This makes the epoxy adhesive easy to bleed to contaminate the bonding pads 110a thereby adversely affecting the wire bonding process. Furthermore, this may cause the bonding layer on the chip 110 formed from the epoxy adhesive to have incomplete filling problem thereby adversely affecting the bonding quality between the semiconductor chip 110 and chip 130.

It is noted that the adhesive layers 112, 132 of the stacked chip package 100 must be cured separately. This prolongs the cycle time for manufacturing the package 100 thereby increasing the production cost.

Curing temperature of the adhesive layers 112, 132 depends on the materials used in the adhesive layers 112, 132; typically, it is higher than the maximum exothermic temperature of the adhesive layers 112, 132. The maximum exothermic temperature of the adhesive layers 112, 132 can be calculated from the heat of cure curve for the adhesive layers 112, 132 detected by Differential Scanning Calorimeter (DSC).

SUMMARY OF THE INVENTION

It is a primary object of the present invention to provide a method for fabricating a stacked chip package wherein the curing process and materials of adhesive layers are optimized to minimize the warpage of the substrate and the chip as well as reduce the cycle time for the assembly process.

The method for fabricating a stacked chip package in accordance with the present invention comprises the steps of: (a) attaching a first semiconductor chip to an upper surface of a substrate through a first adhesive layer, the substrate being provided with a structure for making external electrical connection; (b) partially curing the first adhesive layer such that it gels but does not harden; (c) attaching a second semiconductor chip to the first semiconductor chip through a second adhesive layer; (d) curing the first and second adhesive layer; (e) electrically coupling the first and second semiconductor chips to the structure for making external electrical connection; and (f) forming a package body over the first semiconductor chip, the second semiconductor chip, and a portion of the upper surface of the substrate.

According to one aspect of the present invention, during the step of partial curing, the first adhesive layer is heated to a temperature at which it gels but does not harden (the gelling temperature and time are material dependent, typically 30 minutes at 110° C.). Thus, during the step (b), the heating temperature and time for the first chip and the substrate are reduced such that the first chip and the substrate dose not experience much thermal stress. Therefore, the resulting warpage of the first chip and the substrate is minimized thereby assuring the proceeding of subsequent processes such as the dispensing of the second adhesive layer during step (c). Besides, since the first and the second adhesive layers are cured in one single step, the cycle time for the assemble process illustrated in the present invention is reduced thereby cutting down the production cost.

According to another aspect of the present invention, it is preferable to choose the proper material of each of the adhesive layers such that the maximum exothermic temperature of the second adhesive layer is lower than that of the first adhesive layer. This makes the second adhesive layer cure at a lower temperature during step (d) thereby forming a protection layer on the first chip. Therefore, during the curing process of the first adhesive, the cured second adhesive layer can help the first chip to resist stresses created in the curing process, thereby reducing the problem of die cracking.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
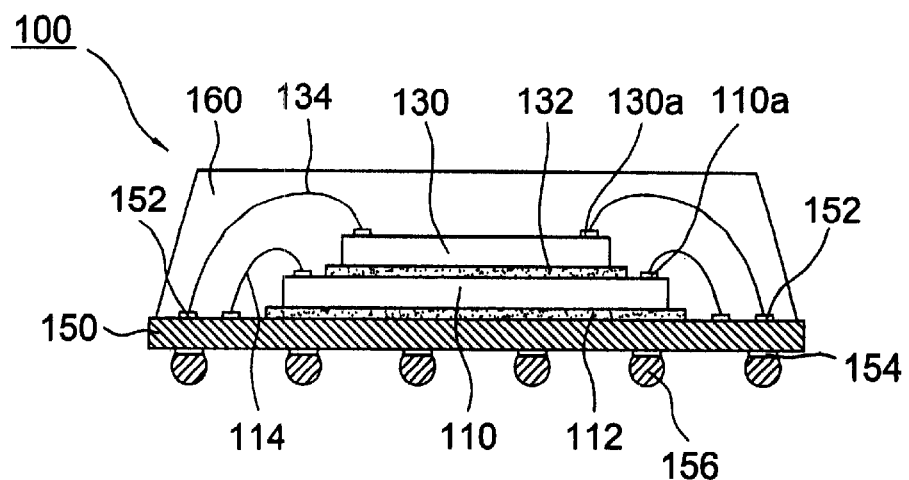
FIG. 1 is a cross-sectional view of a conventional stacked chip package.
Figure 2:
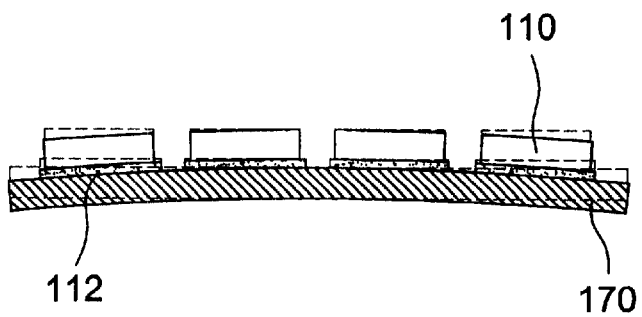
FIG. 2 shows warped substrate and chip after curing the adhesive layer interposed therebetween.
Figure 3:
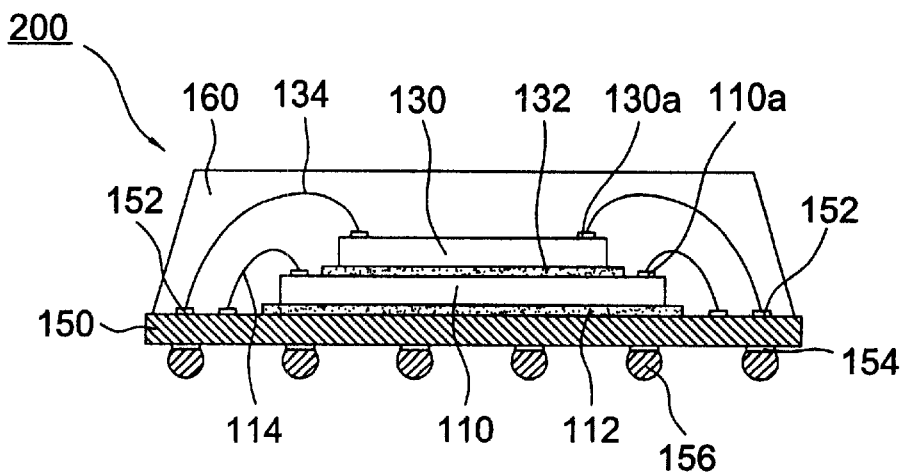
FIG. 3 is a cross-sectional view of a stacked chip package according to a preferred embodiment of the present invention.

FIG. 3. discloses a stacked chip package 200 according to a preferred embodiment of the present invention comprising two chips 110, 130 stacked each other. The chip 110 is attached onto the upper surface of a substrate 150 through an adhesive layer 112, and the chip 130 is attached onto the chip 110 through an adhesive layer 132. Typically, the adhesive layers 112, 132 are made of thermosetting epoxy material such as epoxy resin, silicone, or polyimide. The stacked chip package 200 is characterized in that the maximum exothermic temperature of the adhesive layer 132 is lower than that of the adhesive layer 112 so as to make the adhesive layer 132 cure at a lower temperature thereby forming a protection layer on the chip 110. Therefore, during the curing process of the adhesive layer 112, the cured adhesive layer 132 can help the chip 110 to resist stresses due to CTE mismatch, thereby reducing the problem of die cracking.

The chips 110, 130 are respectively connected to chip connection pads 152 on the upper surface of the substrate 150 through bonding wires 114, 134. The lower surface of the substrate 150 is provided with a plurality of solder pads 154 electrically connected to the chip connection pads 152 on the upper surface of the substrate 150. Each solder pad 154 is provided with a solder ball 156 for making external electrical connection. A package body 160 encapsulates the chips 110, 130, the bonding wires 114, 134 and a portion of the upper of the substrate 150.

FIGS. 4–8 illustrates a method for fabricating a stacked chip package according to a preferred embodiment of the present invention.

Figure 4:
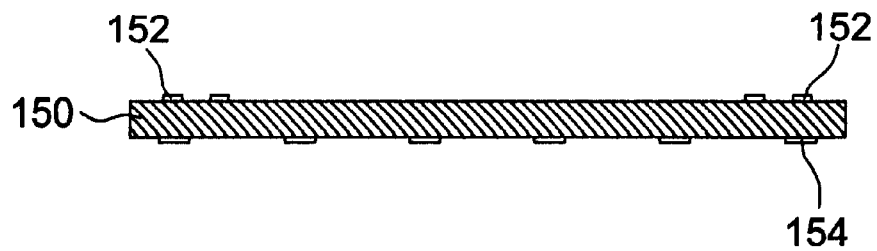
FIG. 4–8 illustrating a method for fabricating the stacked chip package of FIG. 3.

FIG. 4 shows a substrate 150. Preferably, the substrate 150 is made of fiberglass reinforced BT (bismaleimide-triazine) resin or FR-4 fiberglass reinforced epoxy resin. Usually, the thickness of the substrate 150 strip is less than 0.36 mm. The chip connection pads 152 on the upper surface of the substrate 150 are electrically connected to the solder pads 154 on the lower surface of the substrate 150 through conductive traces and vias (not shown).

Figure 5:
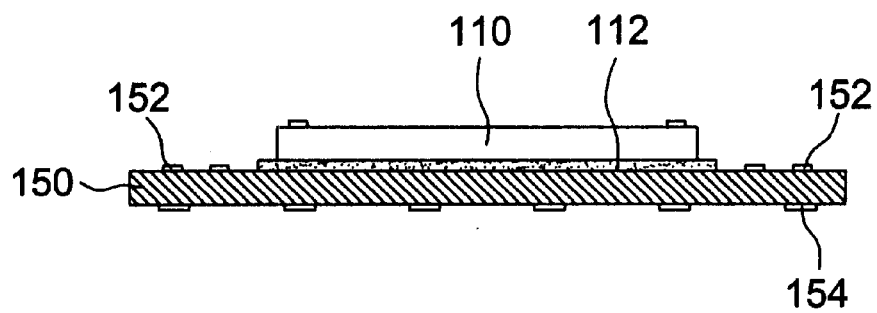
Figure 6:
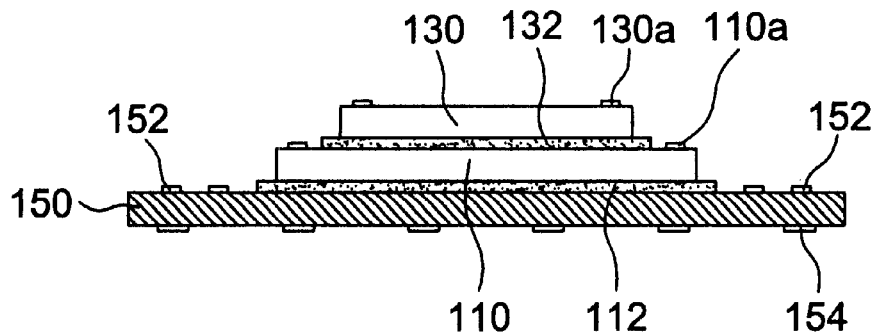

Referring to FIG. 5, the chip 110 is attached onto the upper surface of the substrate 150 through the adhesive layer 112. The adhesive layer 112 is applied onto the upper surface of the substrate 150 by dispensing, and then the chip 110 is attached by conventional automatic chip-attach operation.

Then the adhesive layer 112 is partially cured, i.e., the adhesive layer 112 is heated to a temperature at which it gels but does not harden. The partial curing process can be accomplished by placing the assembly as shown in FIG. 5 in an oven, or blowing hot air on the adhesive layer 112, and heating to the appropriate temperature. The gelling time and temperature is determined by the amount of time required so that there is minimum warpage induced on the chip 110 and the substrate 150 and at the same time the chip 110 can be immobilized in the subsequent processes. The gelling temperature and time are material dependent, for example, one hour at 110° C. for 8355F epoxy adhesive available from ABLESTICK LABORATORY Referring to FIG. 6, the chip 130 is attached onto the chip 110 through the adhesive layer 132. Since the adhesive layer 112 is heated to a temperature at which it gels but does not harden during the previous process, the heating temperature and time for the chip 110 and the substrate 150 are significantly reduced as compared with conventional methods. Thus, the resulting warpage of the chip 110 and the substrate 150 is minimized whereby the adhesive material can not be precisely dispensed to the predetermined positions on the chip 110.

Then, the adhesive layers 112, 132 are completely cured. When the adhesive layers 112, 132 are chosen such that the maximum exothermic temperature of the adhesive layer 112 is about the same as that of the adhesive layer 132, the adhesive layers 112, 132 may be cured simultaneously. The curing process of the adhesive layer (such as 8355F epoxy adhesive available from ABLESTICK LABORATORY) typically requires one hour of precure at 110° C. and two hours of postcure at 175° C.

Alternatively, it is preferable to choose the proper material of each of the adhesive layers 112, 132 such that the maximum exothermic temperature of the adhesive layer 132 is lower than that of the adhesive layer 112. A suitable adhesive layer having a lower maximum exothermic temperature is QMI536 commercially available from QUANTUM MATERIALS, INC. This makes the adhesive layer 132 be cured at a lower temperature. When the adhesive layer 132 is cooled to form a protection layer on the chip 110, the adhesive layer 112 is completely cured. Therefore, during the curing process of the adhesive layer 112, the cured adhesive layer 132 can help the chip 110 to resist stresses created in the curing process, thereby reducing the problem of die cracking.

Figure 7:
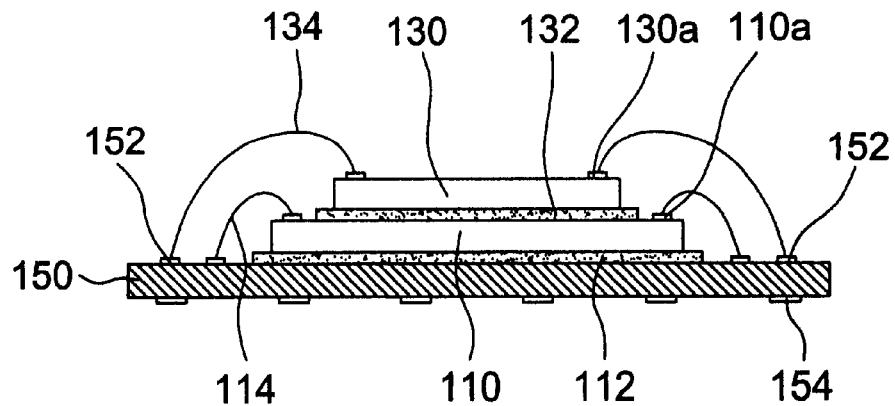

Referring to FIG. 7, the bonding wires 114, 134 are connected to the bonding pads 110a, 130a on the chip 110, 130 and the chip connection pads 152 on the upper surface of the substrate 150 using known wire bonding techniques.

Figure 8:
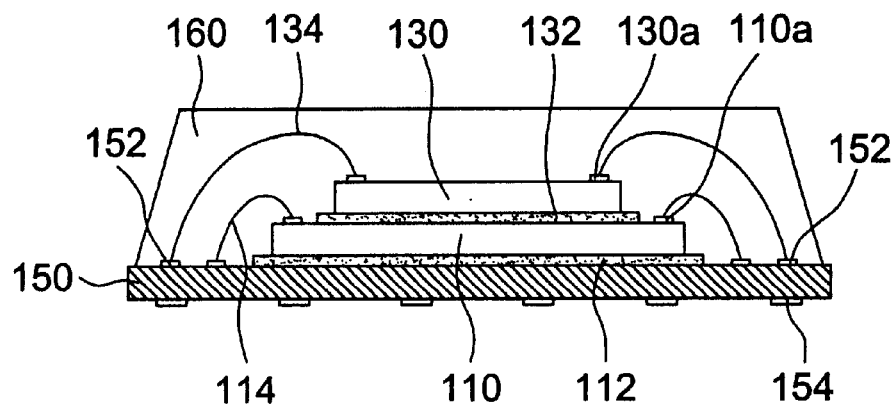

Referring to FIG. 8, the package body 160 is formed over the semiconductor chip 110, 130 and a portion of the upper surface of the substrate 150 using known plastic molding methods such as transfer molding.

Finally, a plurality of solder balls (not shown) are mounted to the solder pads on the lower surface of the substrate 150 so as to obtain the stacked chip package of the present invention.

According to the method for fabricating a stacked chip package of the present invention, since the adhesive layer 112 is heated to a temperature at which it gels but does not harden, the heating temperature for the chip 110 and the substrate 150 are significantly reduced as compared with conventional methods. Thus, the chip 110 and the substrate 150 does not experience much stress thereby minimizing the resulting warpage of the chip 110 and the substrate 150 so as to assure the proceeding of subsequent processes. Besides, since the adhesive layers 112, 132 may be cured in one single step, the cycle time for the assemble process illustrated in the present invention is reduced thereby cutting down the production cost.

Although the invention has been explained in relation to its preferred embodiment, it is to be understood that many other possible modifications and variations can be made without departing from the spirit and scope of the invention as hereinafter claimed.

What is claimed is:

1. A stacked chip package comprising:

a substrate having opposing upper and lower surfaces, the substrate being provided with a structure for making external electrical connection;

a first semiconductor chip attached to the upper surface of the substrate through a first adhesive layer;

a second semiconductor chip attached to the first semiconductor chip through a second adhesive layer, wherein the first and second semiconductor chips are electrically coupling to the structure for making external electrical connection; and a package body encapsulating the first semiconductor chip, the second semiconductor chip, and a portion of the upper surface of the substrate, wherein the maximum exothermic temperature of the second adhesive layer is lower than that of the first adhesive layer.

2. The stacked chip package as claimed in claim 1, wherein the structure for making external electrical connection comprising:

a plurality of chip connection pads on the upper surface of the substrate, the chip connection pads adapted for electrical coupling to the first and second semiconductor chips; and a plurality of solder pads on the lower surface of the substrate, the solder pads being electrically connected to the chip connection pads.

3. The stacked chip package as claimed in claim 2, further comprising a plurality of solder balls mounted to the solder pads on the substrate.

4. The stacked chip package as claimed in claim 1, wherein the substrate is formed from polyimide film.

5. The stacked chip package as claimed in claim 1, wherein the substrate is formed from fiberglass reinforced BT (bismaleimide-triazine) resin.

6. The stacked chip package as claimed in claim 1, wherein the thickness of the substrate is less than about 0.36 mm.

* * * * *